United States Patent
Kaper

(10) Patent No.: US 9,419,580 B2
(45) Date of Patent: Aug. 16, 2016

(54) OUTPUT MATCHING NETWORK HAVING A SINGLE COMBINED SERIES AND SHUNT CAPACITOR COMPONENT

(71) Applicant: Raytheon Company, Waltham, MA (US)

(72) Inventor: Valery S. Kaper, Winchester, MA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 14/529,996

(22) Filed: Oct. 31, 2014

(65) Prior Publication Data

US 2016/0126920 A1  May 5, 2016

(51) Int. Cl.
*H03H 7/38* (2006.01)

(52) U.S. Cl.
CPC .................... *H03H 7/383* (2013.01)

(58) Field of Classification Search
CPC ........................................ H03H 7/383
USPC .......................................... 333/32
See application file for complete search history.

(56) References Cited

U.S. PATENT DOCUMENTS

| | | | |
|---|---|---|---|
| 3,764,932 A | 10/1973 | Robinson | |
| 4,476,446 A | 10/1984 | Blight | |
| 6,191,666 B1 * | 2/2001 | Sheen | H03H 7/0115 333/185 |
| 6,330,165 B1 * | 12/2001 | Kohjiro | H01L 23/04 174/250 |
| 6,646,321 B2 | 11/2003 | Roodnat | |
| 8,299,856 B2 | 10/2012 | Blair | |
| 2002/0158704 A1 * | 10/2002 | Ye | H01P 1/20381 333/99 S |
| 2004/0075127 A1 | 4/2004 | Yamasaki et al. | |

FOREIGN PATENT DOCUMENTS

| | | |
|---|---|---|
| EP | 1 119 111 A1 | 7/2001 |
| WO | WO 2012/136719 A1 | 10/2012 |
| WO | WO 2013/ 54013 A1 | 10/2013 |

OTHER PUBLICATIONS

Notification of Transmittal of the International Search Report and the Written Opinion of the International Searching Authority, or the Declaration, PCT/US2015/050892, Nov. 26, 2015, 1 page.
International Search Report, PCT/US2015/050892, Nov. 26, 2015, 4 pages.
Written Opinion of the International Searching Authority, PCT/US2015/050892, Nov. 26, 2015, 5 pages.

* cited by examiner

*Primary Examiner* — Stephen E Jones
*Assistant Examiner* — Scott S Outten
(74) *Attorney, Agent, or Firm* — Daly, Crowley, Mofford & Durkee, LLP

(57) ABSTRACT

A matching network requiring a predetermined shunt capacitance in a transformation of the impedance at the output to a transistor to a load. The matching network includes a vertically stacked shunt capacitor, for providing the entire predetermined capacitance, and a series DC blocking capacitor.

5 Claims, 5 Drawing Sheets

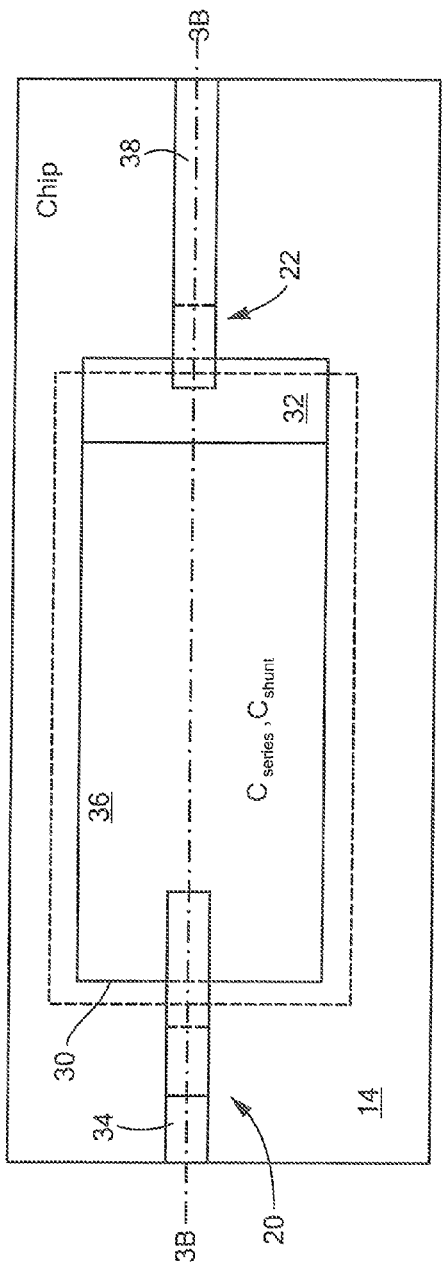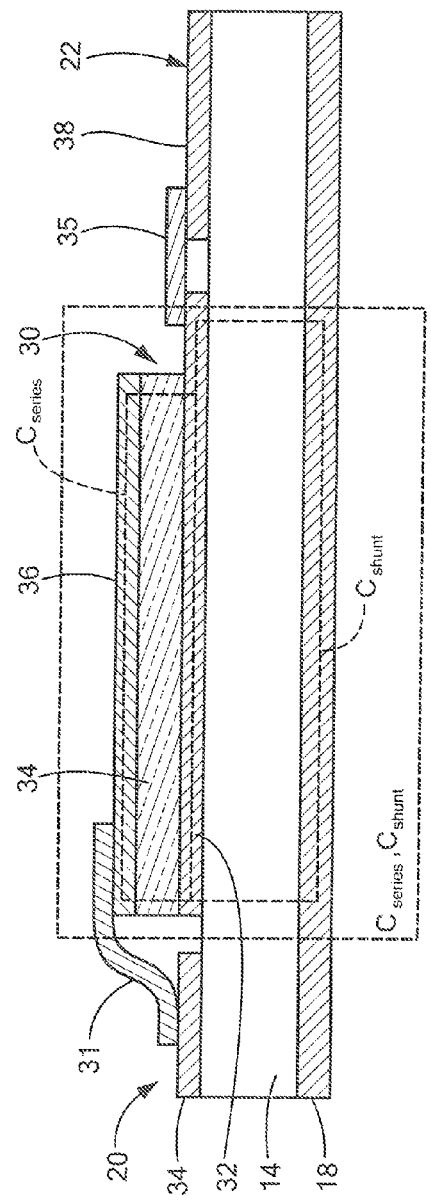
FIG. 3A
FIG. 3B

OUTPUT MATCHING NETWORK HAVING A SINGLE COMBINED SERIES AND SHUNT CAPACITOR COMPONENT

TECHNICAL FIELD

This disclosure relates generally to output matching networks and more particularly to output matching networks for semiconductor structures having reduced topological area.

BACKGROUND

As is known in the art, in microwave analog circuits in general, and in power amplifiers specifically, an Output Matching Network (OMN), comprising passive components (capacitors, inductors, resistors, transmission lines and other distributed circuit elements) is used to transform an external circuit load impedance, $Z_L$, (often equal to 50 Ohm) at one of its Radio Frequency (RF) output ports to a specific complex impedance at its input port as shown in FIG. 1. The input port is connected to an RF output of an active device, for example, the drain terminal in a common-source Field Effect Transistor (FET) or collector terminal in a common-emitter Bipolar Junction Transistor (BJT). The specific complex impedance presented by the OMN to the active device is selected to maximize one or several of its performance parameters; e.g., output power density, efficiency, linearity etc. Thus, OMN is connected between the output of a transistor used to amplify an input signal, and the external load for the purpose of providing a proper impedance transformation to: maximize the gain of the amplifier, or maximize the power provided by the amplifier to the external load, or maximize the efficiency of the amplifier, or maximize the linearity of the amplifier, for example.

More particularly, as is also known, the active device is generally coupled to a Direct Current (DC) supply, for example a bias drain voltage supply for a common-source FET, or a collector bias voltage source for a common-emitter BJT. Thus, the OMN is often required to block DC current from flowing between the bias voltage source and the RF output. Further, the OMN is required to, as noted above, perform an impedance transformation between the output of the active device and the input to the load with the least amount of signal being dissipated within the network (e.g. OMN loss needs to be minimized), so the overall circuit performance is dominated by that of the active device. Thus, in addition to the DC blocking, a part of the matching network's impedance transformation is sometimes accomplished by a predetermined shunt capacitance located in a close proximity to the DC-blocking series capacitor. Thus, in order to provide the required DC blocking and the required shunt capacitance, the OMN may include a DC blocking capacitor and a shunt capacitor section having a DC blocking capacitor and a shunt capacitor located in a close proximity to each other.

One integrated circuit implementation for the DC blocking capacitor and a shunt capacitor section of the OMN is shown in FIGS. 1A-1C. Here, a substrate has formed thereon a semiconductor disposed in a first portion of a top surface of the substrate and a ground plane conductor on a bottom surface of the substrate. The output matching network includes an input transmission line disposed over the substrate for coupling to: the output of a transistor device formed in the semiconductor layer; and a bias terminal for connection to a (DC) bias voltage source. An output input transmission line disposed over the substrate having an output adapted for coupling to a load. A series DC blocking capacitor is formed over one surface portion of the substrate. The bottom plate of the series capacitor is connected to the upper plate of the shunt capacitor through a portion of an output transmission line that overlays a portion of the upper plate and an air bridge conductor, as shown. The bottom plate of the shunt capacitor is connected to an underling portion the ground plane conductor through a conductive through-substrate via, as shown. It is noted that a parasitic capacitance between the bottom plate of the series capacitor and an underling portion of the ground plane conductor contributes a small fraction of the total shunt capacitance required for the OMN in the transformation of the impedance at the output to the transistor to the load. Thus, to obtain the required total shunt capacitance a separate lumped shunt capacitor is provided, as shown. It is noted that a parasitic capacitance between the bottom plate of the series capacitor and an underling portion of the ground plane conductor contributes to the total shunt capacitance of the OMN's DC blocking capacitor/Shunt capacitor section.

The performance of a small shunt capacitor is often very sensitive to process variations (thin-film dielectric thickness, lithography resolution). Its loss, and as a result the overall OMN loss is typically larger in comparison to the loss of its distributed equivalents because of higher dielectric loss tangent of thin-film insulating material The interconnect between separate series and shunt capacitors often requires to be reactively compensated, and also increases the OMN loss.

Another integrated circuit implementation for the DC blocking capacitor and a shunt capacitor section of the OMN is shown in FIGS. 2A-2C as distributed components. As noted above, a parasitic capacitance between the bottom plate of the series capacitor and an underling portion of the ground plane conductor contributes a fraction, typically a small one, of the total shunt capacitance required for the OMN in the transformation of the impedance at the output to the transistor to the load. Thus, to obtain the required total shunt capacitance a separate distributed shunt capacitor is provided, as shown. Here, the series capacitor and the shunt capacitor are formed over different surface portions of the substrate. The bottom plate of the series capacitor is connected to the upper plate of the shunt capacitor through a portion of an output transmission line that overlays a portion of the upper plate. Here, a portion of the output transmission line is connected to a section of a transmission line having a length selected to provide an open circuit transmission line stub, as shown. The open-circuit transmission line stub has surface area selected to provide the upper plate of the shunt capacitor. The bottom plate of the shunt capacitor is provided by an underling portion of the ground plane conductor.

The implementation in FIGS. 2A-C with the distributed implementation for the shunt capacitor occupies a larger chip area in comparison with the implementation in FIGS. 1A-C because of much thicker dielectric. The interconnection between separate series and shunt capacitors often requires to be reactively compensated, and also increases the OMN loss.

SUMMARY

In accordance with the present disclosure, a semiconductor structure is provided having a matching network requiring a predetermined shunt capacitance in a transformation of the impedance at the output to a transistor to a load. The matching network includes: a vertically stacked shunt capacitor, for providing the entire predetermined capacitance, and series DC blocking capacitor.

In one embodiment, a semiconductor structure is provided having: a substrate having: a semiconductor disposed in a first portion of a top surface of the substrate and a ground plane conductor on a bottom surface of the substrate; and a matching network requiring a predetermined shunt capacitance in a transformation of the impedance at the output to a transistor to a load. The matching network includes: a vertically stacked shunt capacitor, for providing the entire predetermined capacitance, and series DC blocking capacitor for blocking direct current from a direct current bias voltage source coupled to the transistor. The matching network also includes: an input transmission line disposed over the substrate for coupling to: the output of the transistor device formed in the semiconductor layer; and a bias terminal for connection to a direct current bias voltage source; an output input transmission line disposed over the substrate having an output adapted for coupling to the load; a first conductive layer disposed over a second portion of the top surface of the substrate connected to a strip conductor of the input transmission line; and a dielectric layer disposed on the first dielectric layer. The second conductive layer is disposed on the dielectric layer and connected to a strip conductor of the output transmission line. The first conductive layer, the dielectric layer and the second conductive layer form a first capacitor. The second conductive layer and an underlying portion of the ground plane conductor form a second capacitor. The second capacitor provides the predetermined shunt capacitance required in the transformation of the impedance at the output to the transistor to the load. The first capacitor blocks direct current from the DC bias voltage source to the output transmission line.

With such an arrangement, two circuit components (a large series capacitor and a smaller shunt capacitor) occupy the same surface area on the substrate and are thereby integrated into one physical component; a large series capacitor. Therefore, the structure simultaneously performs required impedance transformation, minimizing OMN insertion loss, decouples the DC bias and maintains layout compactness by using one physical component and eliminating interconnects between the two circuit components.

The inventor has recognized that integrating two circuit components: a large series capacitor and a smaller shunt capacitor, into one physical component; a large series MIM capacitor, sizing the MIM series capacitor to obtain needed shunt capacitance to ground. by taking into account the chip's substrate thickness and its effective dielectric constant, the resulting structure simultaneously performs required impedance transformation, minimizes OMN insertion loss, and decouples the DC bias and maintaining layout. The inventor recognized that by using a large area for the series capacitor than the prior art, since its function is to provide DC blocking and the additional area will only further reduce the series RF impedance, this larger area can be used to provide the entire shunt capacitance required in a transformation of the impedance at the output to a transistor to a load even though it uses the dielectric constant of a thicker substrate. Further, the OMN insertion loss is minimized and a compact layout is achieved because the two capacitors are integrated into a single physical component—a series capacitor having a large area to provide: RF-shorting; DC-decoupling, and required impedance transformation similar to that of a small shunt capacitor because the bottom plate of the MIM capacitor forms a small shunt capacitor to ground through the chip substrate's dielectric with the structure. Further, a smaller dielectric loss tangent of the substrate is achieved in comparison to that of a thin-film insulator in a stand-alone MIM shunt capacitor in combination with elimination of parasitic resistance and inductance of though-substrate via helps to achieve lower OMN insertion loss. Further, the inventor has recognized that eliminating a small lumped shunt capacitor in FIGS. 1A and 1B makes the OMN and the overall circuit, in general, less sensitive to variation in semiconductor fabrication process.

The details of one or more embodiments of the disclosure are set forth in the accompanying drawings and the description below. Other features, objects, and advantages of the disclosure will be apparent from the description and drawings, and from the claims.

DESCRIPTION OF DRAWINGS

FIG. 3A is a plan view of a DC blocking capacitor and a shunt capacitor section of the OMN of FIG. 3 according to the disclosure; and FIG. 3B is a cross sectional view of the DC blocking capacitor and a shunt capacitor section of the OMN of FIG. 3, such cross section being taken along line 3B-3B in FIG. 3 according to the disclosure.

Like reference symbols in the various drawings indicate like elements.

DETAILED DESCRIPTION

Figure 3:
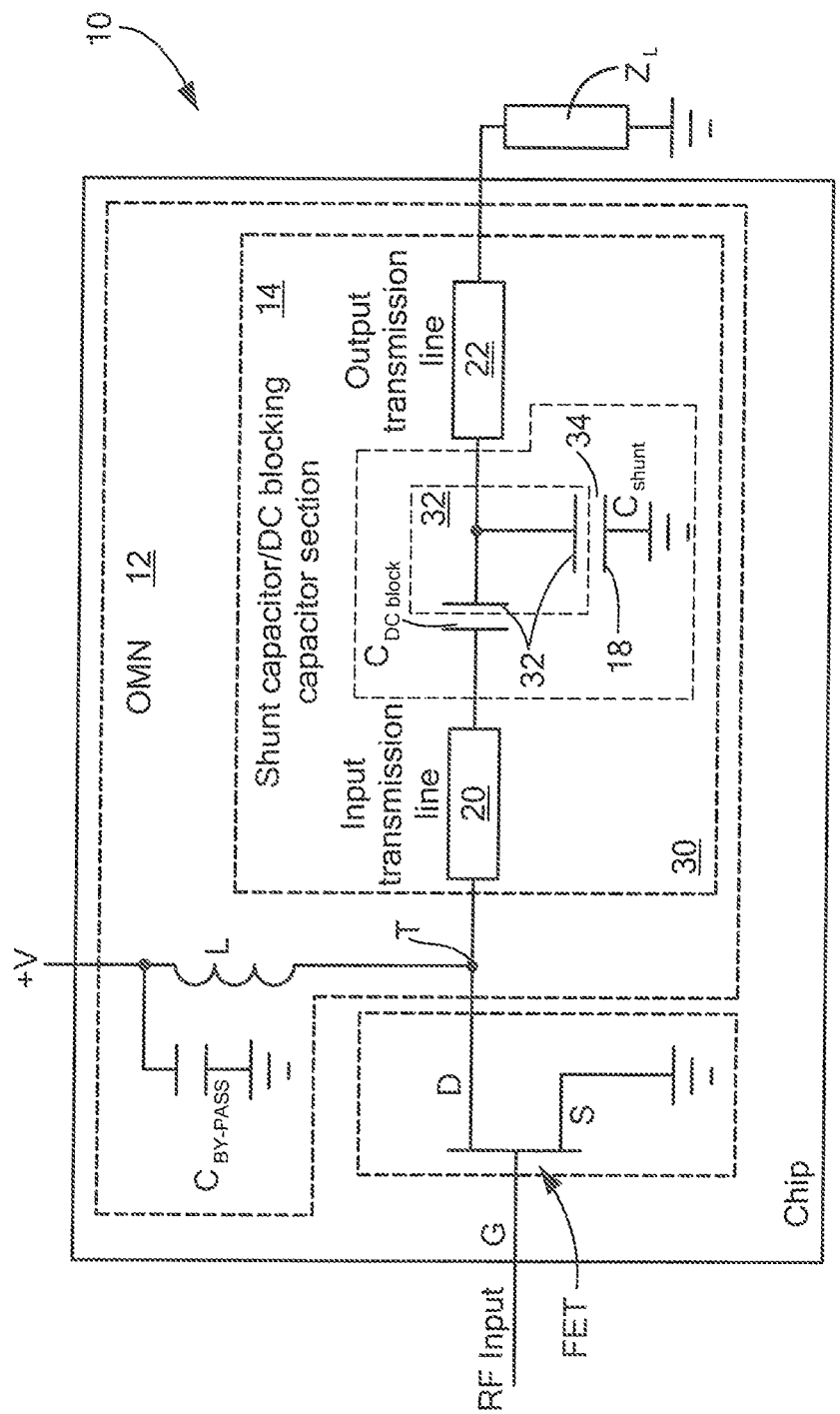
FIG. 3 is a schematic diagram of a radio frequency (RF) power amplifier having an Output Matching Network (OMN) formed on an integrated circuit chip coupled to external circuit load impedance, $Z_L$, wherein the OMN includes a DC blocking capacitor and a shunt capacitor section have a series capacitor and shunt capacitor formed on the same surface portion of the chip in accordance with the disclosure.

Referring now to FIGS. 3, 3A and 3B, a radio frequency (RF) power amplifier 10 is shown having an Output Matching Network (OMN) 12 formed on a substrate, here an integrated circuit chip 14 coupled to external circuit load impedance, $Z_L$. The RF amplifier 10 includes a field effect transistor (FET) formed in a semiconductor layer 15 on the substrate 14. The FET has a gate G fed by an RF signal. The source S is connected the OMN 12, as shown, and the drain D is coupled to ground, as shown More particularly, the substrate 14 has: the semiconductor layer 15 disposed in a first portion of a top surface of the substrate 14 and a ground plane conductor 18 on a bottom surface of the substrate 14. The OMN 12 is a matching network required to provide a predetermined shunt capacitance $C_{shunt}$ in a transformation of the impedance at the output of the transistor FET to the load $Z_L$. The OMN 12 includes: an input transmission line 20 disposed over the substrate 14 for coupling to: the output of the transistor device (the FET) formed in the semiconductor layer 15; and a bias terminal T for connection a +V dc voltage source through an RF blocking inductor L and to ground through an RF by-capacitor, $C_{by\text{-}pass}$ in a conventional manner, as shown; an output input transmission line 22 disposed over the substrate having an output adapted for coupling to the load $Z_L$. A series capacitor $C_{series}$ and shunt capacitor $C_{shunt}$ are formed in a vertically stacked relationship as shown in FIG. 3B to provide as a combined single series and shunt capacitor component 30 over a common surface region of the chip 14.

Figure 1:
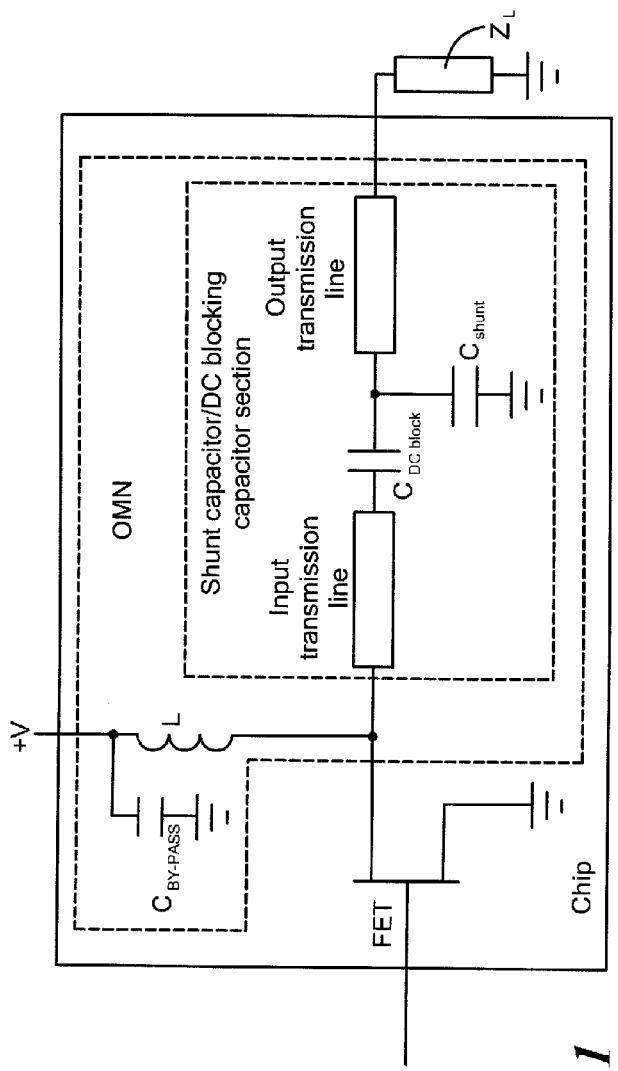
FIG. 1 is a schematic diagram of a radio frequency (RF) power amplifier having an Output Matching Network (OMN) formed on an integrated circuit chip coupled to external circuit load impedance, $Z_L$, wherein the OMN includes a DC blocking capacitor and a shunt capacitor section have a series capacitor and shunt capacitor formed on different surface portions of the chip in accordance with the PRIOR ART.
Figure 1C:
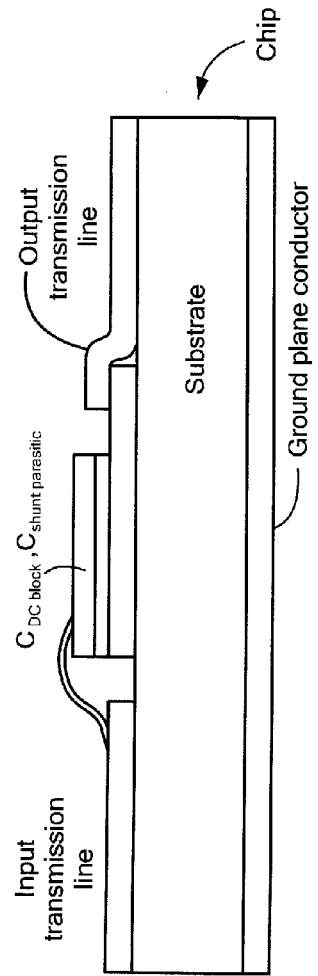
FIG. 1C is a cross sectional view of the DC blocking capacitor and a shunt capacitor section of the OMN of FIG. 1A, such cross section being taken along line 1C-1C in FIG. 1A.
Figures 1A, 1B:
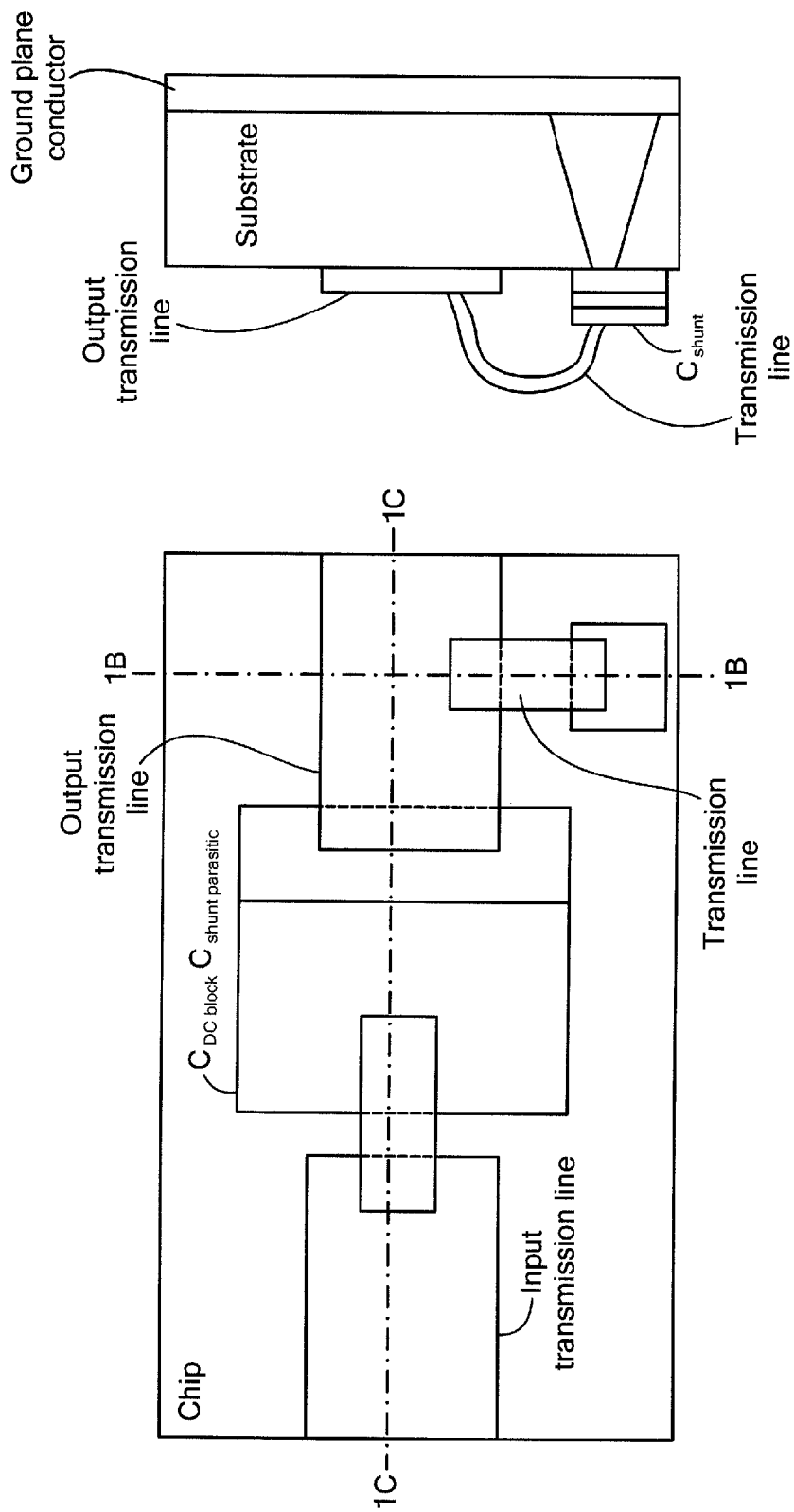
FIG. 1A is a plan view of a DC blocking capacitor and a shunt capacitor section of the OMN according to the PRIOR ART.
FIG. 1B is a cross sectional view of the DC blocking capacitor and a shunt capacitor section of the OMN of FIG. 1A, such cross section being taken along line 1B-1B in FIG. 1A.
Figure 2C:
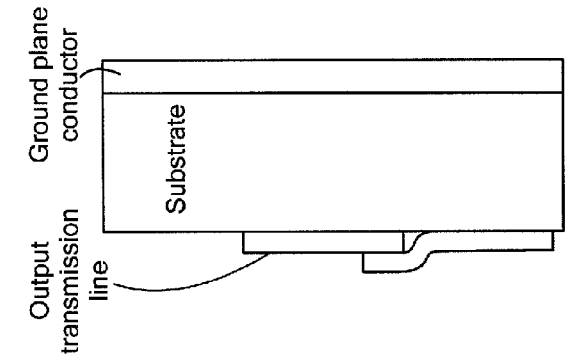
FIG. 2C is a cross sectional view of the DC blocking capacitor and a shunt capacitor section of the OMN of FIG. 2A, such cross section being taken along line 2C-2C in FIG. 2A.
Figure 2B:
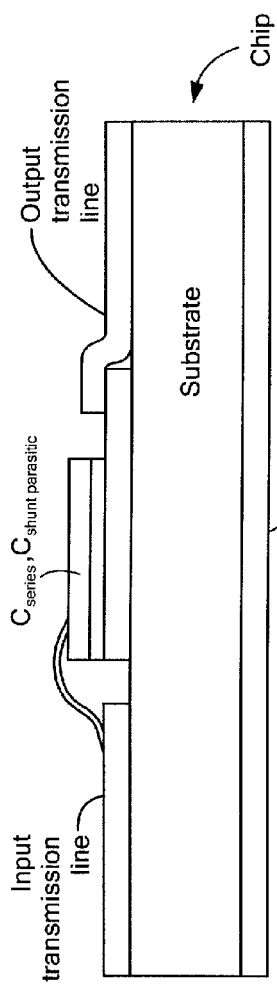
FIG. 2B is a cross sectional view of the DC blocking capacitor and a shunt capacitor section of the OMN of FIG. 2A, such cross section being taken along line 2B-2B in FIG. 2A.
Figure 2A:
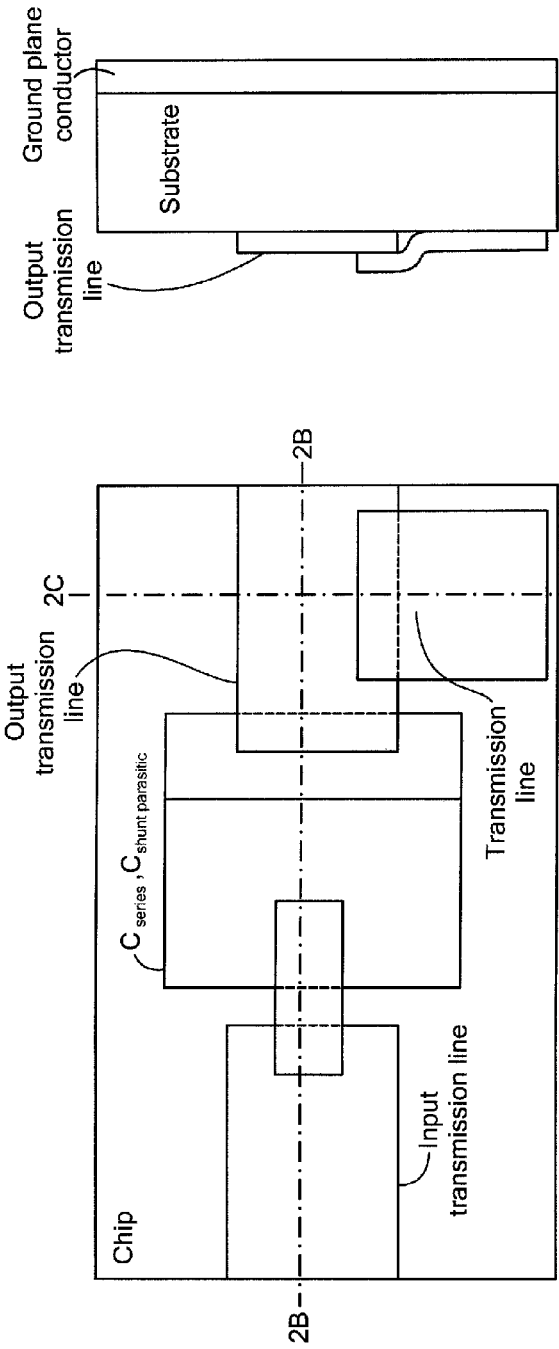
FIG. 2A is a plan view of a DC blocking capacitor and a shunt capacitor section of the OMN according to the PRIOR ART.

More particularly, the combined single series and shunt capacitor component 30 include: a first conductive layer 32 disposed over a second portion of the top surface of the substrate 15 connected to a strip conductor 34 (FIG. 3B) of the input transmission line 20 through an air bridge 31; a dielectric layer 34 disposed on the first conductive layer 32; and a second conductive layer 36 disposed on the dielectric 34 layer and is connected to a strip conductor 38 of the output transmission line 22 through an air bridge 35, as shown. The first conductive layer 32, the dielectric layer 34 and the second conductive layer 36 form a first capacitor, here having the series capacitance $C_{series}$. The second conductive layer 36 and an underlying portion of the substrate 14 and an underlying portion of the ground plane conductor 18 form a second capacitor, here having the shunt capacitance, $C_{shunt}$. The second capacitor provides the predetermined shunt capacitance required in the transformation of the impedance at the output to the transistor FET to the load $Z_L$ and the first capacitor blocks direct current from the direct current bias voltage source +V, to the output transmission line 22. It is noted that the area occupied by the combined single series and shunt capacitor component 30 is smaller than the area occupied by the series capacitor $C_{Series}$ and separate shunt capacitors $C_{shunt}$, shown in FIGS. 1A and 2A.

Referring to FIG. 3B, it is noted that the top dotted rectangle outlines a region for $C_{series}$ and the bottom dotted rectangle outlines a region for $C_{shunt}$. Thus, since the two capacitors share a common plate, namely conductor 32, they share a common dotted line representing the common conductive conductor, namely, the common line of the bottom of the top rectangle and the top of the bottom rectangle.

The structure simultaneously performs required impedance transformation, minimizing OMN insertion loss, decouples the DC bias and maintains layout compactness by using one physical component and eliminating interconnects between the two circuit components. As noted above, the inventor has recognized that integrating two circuit components: a large series capacitor and a smaller shunt capacitor, into one physical component a large series MIM capacitor, sizing the MIM series capacitor to obtain needed shunt capacitance to ground. The inventor has recognized that by using a large area for the series capacitor than the prior art, since its function is to provide DC blocking and the additional area will only further reduce the series RF impedance, this larger area can be used to provide the entire shunt capacitance required in a transformation of the impedance at the output to a transistor to a load even though it uses the dielectric constant of a thicker substrate. Thus, OMN insertion loss is minimized and a compact layout is achieved because the two capacitors are integrated into a single physical component; a series capacitor having a large area to provide: RF-shorting; DC-decoupling, and required impedance transformation similar to that of a small shunt capacitor because the bottom plate of the MIM capacitor forms a small shunt capacitor to ground through the chip substrate's dielectric with the structure. Further, a smaller dielectric loss tangent of the substrate is achieved in comparison to that of a thin-film insulator in a stand-alone MIM shunt capacitor in combination with elimination of parasitic resistance and inductance of though-substrate via helps to achieve lower OMN insertion loss.

A number of embodiments of the disclosure have been described. Nevertheless, it will be understood that various modifications may be made without departing from the spirit and scope of the disclosure. For example, while the structure has been described for a specific example, it should be understood that other active devices, materials, thickness and operating conditions may be used. Accordingly, other embodiments are within the scope of the following claims.

What is claimed is:

1. A structure, comprising:
(A) an integrated circuit chip substrate;
(B) a transistor formed in a semiconductor layer disposed in a first portion of a top surface of the substrate, the transistor having an output for producing a microwave frequency signal, the output being coupled to a DC voltage source;
(C) a ground plane conductor disposed on a bottom surface of the substrate;
(D) a matching network coupled between the output of the transistor and a load, the matching network, comprising:
(i) an input transmission line coupled to the output of the transistor, the input transmission line comprising:
(a) an input strip conductor disposed on a second portion of the top surface of the substrate;
(b) a first portion of the ground plane conductor disposed under the input strip conductor; and
(c) a portion of the substrate disposed between the input strip conductor and the first portion of the ground plane conductor;
(ii) an output transmission line coupled to the load, the output transmission line comprising:
(a) an output strip conductor disposed on a third portion the top surface of the substrate;
(b) a second portion of the ground plane conductor disposed under the output strip conductor; and
(c) a portion of the substrate disposed between the output strip conductor and the second portion of the ground plane conductor;
(iii) a first conductive layer disposed on a third portion of the top surface of the substrate and connected to the output strip conductor of the output transmission line;
(iv) a dielectric layer disposed on the first conductive layer;
(v) a second conductive layer disposed on the dielectric layer and connected to the input strip conductor of the input transmission line;
(vi) wherein the first conductive layer, the dielectric layer and the second conductive layer form a first capacitor, the first capacitor being disposed on the third portion of the top surface of the substrate;

(vii) wherein the first conductive layer, an underlying portion of the substrate, and an underlying third portion of the ground plane conductor form a second capacitor;

(viii) wherein the second capacitor provides a shunt capacitance for the matching network; and (ix) wherein the first capacitor provides a series capacitance between the input transmission line and the output transmission line to block direct current from passing from the DC voltage source to load.

2. The structure recited in claim 1 wherein the dielectric layer is different from the substrate.

3. The structure recited in claim 2 wherein the dielectric layer is separated from the top surface of the substrate by the first conductive layer.

4. A semiconductor structure, comprising:

a substrate having: a semiconductor layer disposed in a first portion of a top surface of the substrate and a ground plane conductor on a bottom surface of the substrate;

a matching network requiring a predetermined shunt capacitance in transformation of the impedance at an output to a transistor formed in the semiconductor to a load, comprising;

an input transmission line disposed over the substrate for coupling to the output of the transistor formed in the semiconductor layer; and a bias terminal for connection to a direct current bias voltage source;

an output transmission line disposed over the substrate having an output adapted for coupling to the load;

a first conductive layer disposed over a second portion of the top surface of the substrate connected to a strip conductor of the output transmission line;

a dielectric layer disposed on the first conductive layer, the dielectric layer being separated from the substrate by the first conductive layer;

a second conductive layer disposed on the dielectric layer and connected to a strip conductor of the input transmission line;

wherein the first conductive layer, the dielectric layer and the second conductive layer form a first capacitor;

wherein the first conductive layer, an underlying portion of the substrate, and an underlying portion of the ground plane conductor form a second capacitor;

wherein the second capacitor provides the predetermined shunt capacitance required in the transformation of the impedance at the output to the transistor to the load; and wherein the first capacitor is in series between the input transmission line and the output transmission line to block direct current from the direct current bias voltage source to the output transmission line.

5. A structure, comprising:

an integrated circuit chip substrate:

a ground plane conductor disposed on a bottom surface of the substrate;

a first conductive layer disposed on a portion of a top surface of the substrate;

a dielectric layer disposed on the first conductive layer, the dielectric layer being separated from the substrate by the first conductive layer;

a second conductive layer disposed on the dielectric layer;

wherein the first conductive layer, the dielectric layer and the second conductive layer form a first capacitor, the first capacitor being disposed on the top surface of the substrate;

wherein the first conductive layer, an underlying portion of the substrate, and an underlying third portion of the ground plane conductor form a second capacitor.

* * * * *